(12) United States Patent
Kandah et al.

(10) Patent No.: US 9,673,809 B1
(45) Date of Patent: Jun. 6, 2017

(54) REPLICATION OF A DRIVE SIGNAL ACROSS A GALVANIC ISOLATION BARRIER

(71) Applicant: FREESCALE SEMICONDUCTOR, INC., Austin, TX (US)

(72) Inventors: Ibrahim S. Kandah, Austin, TX (US); Fred T. Brauchler, Austin, TX (US); Kim R. Gauen, Austin, TX (US); David D. Putti, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/079,729

(22) Filed: Mar. 24, 2016

(51) Int. Cl.
| | |
|---|---|
| *H03K 17/689* | (2006.01) |
| *H03K 17/567* | (2006.01) |
| *H03K 17/691* | (2006.01) |
| *H02P 27/08* | (2006.01) |

(52) U.S. Cl.
CPC ........... *H03K 17/567* (2013.01); *H02P 27/08* (2013.01); *H03K 17/691* (2013.01)

(58) Field of Classification Search
CPC ..... H02J 7/00; H02J 9/06; B60L 11/18; H02P 6/14; F02B 75/02; G01R 31/02; G05F 1/10; G05F 1/147; G06F 19/00; G06F 1/28; H01M 10/42; H01M 10/44; H02M 3/24; H02M 3/28; H02M 7/04; H04B 10/00
USPC ..... 318/400.27, 400.01, 400.26; 307/66, 64; 320/145, 147, 152, 160, 163; 323/258, 323/259; 361/18, 93.4, 101, 41; 257/499, 501, 500, 506
See application file for complete search history.

(56) References Cited

U.S. PATENT DOCUMENTS

| | | | | |
|---|---|---|---|---|
| 4,860,185 A | * | 8/1989 | Brewer | G06F 1/28 307/66 |
| 5,138,543 A | * | 8/1992 | Harm | H02M 3/33507 363/21.04 |
| 5,579,197 A | * | 11/1996 | Mengelt | H02J 9/062 307/66 |
| 5,680,031 A | * | 10/1997 | Pavlovic | H02J 7/0093 320/145 |
| 5,870,401 A | * | 2/1999 | Riley | G05B 19/042 327/143 |

(Continued)

OTHER PUBLICATIONS

ST, "STGAP1S; gapDRIVE: galvanically isolated single gate driver", DocID027190, Rev. 1, Nov. 2014.

*Primary Examiner* — Rita Leykin
(74) *Attorney, Agent, or Firm* — David G. Dolezal

(57) ABSTRACT

In one embodiment, a control system includes a first voltage domain circuit. The first voltage domain circuit includes circuitry for operating in a first voltage domain. The control system includes a second voltage domain circuit. The second voltage domain circuit includes circuitry for operating in a second voltage domain. The second voltage domain circuit includes a driver circuit. The driver circuit for providing a control terminal driving signal to make conductive a power switch. The second voltage domain circuit includes a replication circuit, the replication circuit having an output to provide a replicated signal of the control terminal driving signal. The control system includes a galvanic isolation barrier signal path between the first voltage domain circuit and the second voltage domain circuit. The replicated signal is provided by the second voltage domain circuit to the first voltage domain circuit via the galvanic isolation barrier signal path.

20 Claims, 7 Drawing Sheets

(56) References Cited

U.S. PATENT DOCUMENTS

| | | | | |
|---|---|---|---|---|
| 6,078,165 | A * | 6/2000 | Ashtiani | H02J 7/0021 |
| | | | | 320/116 |
| 7,417,875 | B2 * | 8/2008 | Chandrasekaran | H02M 3/33592 |
| | | | | 323/356 |
| 8,390,093 | B1 | 3/2013 | Hopper et al. | |
| 8,471,604 | B2 * | 6/2013 | Permuy | H03K 17/10 |
| | | | | 327/108 |
| 8,526,206 | B2 * | 9/2013 | Fotherby | H02M 1/08 |
| | | | | 327/424 |
| 8,829,949 | B2 * | 9/2014 | Zajc | H03K 19/017 |
| | | | | 326/83 |
| 8,947,126 | B2 * | 2/2015 | Barrenscheen | H03K 17/162 |
| | | | | 327/108 |
| 8,963,622 | B2 * | 2/2015 | Lee | H04L 25/4902 |
| | | | | 323/282 |
| 9,031,140 | B2 * | 5/2015 | Zimmanck | H04B 5/0025 |
| | | | | 307/104 |
| 9,039,279 | B2 | 5/2015 | Sundaramoorthy et al. | |
| 9,118,253 | B2 * | 8/2015 | Telefus | H02M 3/33523 |
| 9,543,942 | B2 * | 1/2017 | Sicard | H03K 17/168 |
| 2013/0163686 | A1 * | 6/2013 | Zimmanck | H04B 5/0025 |
| | | | | 375/259 |
| 2014/0028369 | A1 * | 1/2014 | Fang | H03L 5/00 |
| | | | | 327/312 |
| 2014/0292243 | A1 * | 10/2014 | Bouchez | H02M 7/003 |
| | | | | 318/400.29 |
| 2016/0077566 | A1 * | 3/2016 | Caubert | B60L 11/1803 |
| | | | | 713/340 |
| 2016/0080181 | A1 * | 3/2016 | Yun | H04L 27/04 |
| | | | | 375/312 |

* cited by examiner

REPLICATION OF A DRIVE SIGNAL ACROSS A GALVANIC ISOLATION BARRIER

BACKGROUND OF THE INVENTION

Field of the Invention

This invention relates in general to power switch driver circuits.

Description of the Related Art

Some transistors such as an insulated gate bipolar transistor (IGBT) are utilized in voltage domains that have a significantly higher supply voltage than the digital control circuitry that is used to control the operation of the transistor. For example, the voltage of a gate drive signal of an IGBT may swing from 0 volts to 100s of volts, while the voltage of the digital control circuitry for the IGBT operates at a relatively lower voltage (e.g. 3.3 volts, 5 volts). A galvanic isolation barrier can be used to transfer information between the two different voltage domains.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a system control circuit includes a low voltage domain circuit that generates a pulse signal to control the generation of a control terminal drive signal by a high voltage domain circuit of the system control circuit. A replication circuit in the high voltage domain circuit replicates the drive signal provided to the control terminal. The replicated signal is then provided across a galvanic isolation barrier to the low voltage domain circuit. The low voltage domain circuit then utilizes the replicated signal to determine whether the high voltage domain driver circuit is operating properly. If the low voltage domain circuit does not receive the replicated signal at a predetermined period of time, it will cease driving the pulse signal to the high voltage domain circuit. In one embodiment, the replication circuit receives the control terminal driving signal and utilizes comparator circuitry to produce the replicated signal. In one embodiment, the high voltage domain circuit provides the replicated signal across a galvanic isolation barrier signal line that is used to signal the generation of an interrupt. When signaling an interrupt, the signal line provides a pulsing signal at a much higher frequency than the frequency of the replicated signal.

Figure 1:
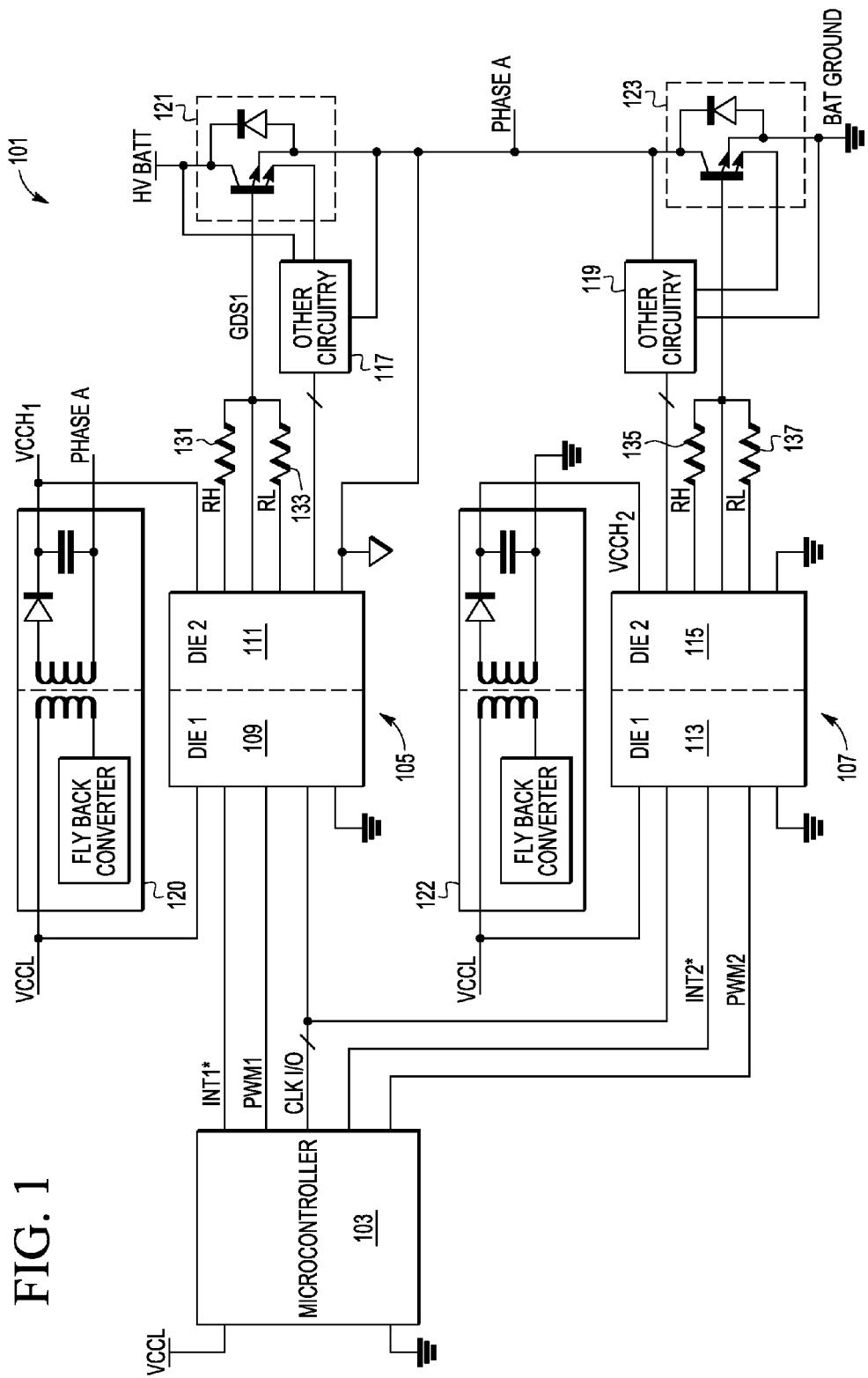
FIG. 1 is a circuit diagram of a portion of a system that utilizes IGBTs according to one embodiment of the present invention.

FIG. 1 is a circuit diagram of a portion of a control system for a multi-phase electric motor. System 101 is a variable speed motor controller that controls the operation of the motor (not shown) by controlling the duty cycle or "on time" of the pulses provided to the gates of the IGBTs (121, 123) connected to the phase windings (e.g. "Phase A" terminal) of the motor. In one embodiment, the "on times" of the IGBTs are controlled to approximate sinusoidal signals provided to the motor windings. In the embodiment shown, microcontroller 103 provides a pulse width modulated signal PWM1 to driver module 105 and pulse width modulated signal PWM2 to driver module 107 at a frequency and duty cycles to turn the IGBTs 121 and 123 on and off. The gates of IGBTs 121 and 123 are controlled by driver modules 105 and 107, respectively.

Each driver module 105 and 107 is implemented as an integrated circuit package that includes a low voltage die (109, 113) and a high voltage die (111, 115). Low voltage die (109, 113) includes circuitry that operates in the voltage domain of VCCL (e.g. +3.3 VDC), which in the embodiment shown, is the same voltage domain as that of microcontroller 103. The high voltage die (111, 115) includes circuitry that operates in a higher voltage domain (e.g. 15 VDC). In the embodiment shown, high voltage die 111 and 115 are each supplied from a voltage regulator 120 and 122, respectively, that are supplied from the power supply of the low voltage domain (VCCL). In the embodiment shown, the low voltage output terminal of regulator 120 is connected to the Phase A winding terminal (Phase A) such that the supply voltage provided to die 111 is at a particular voltage (e.g. 15 volts) above the voltage of the phase A winding terminal. The high voltage die operates at a voltage above the phase A winding so that the voltage provided to the gate of IGBT 121 will always be above the Phase A winding terminal. However, in other embodiments, die 111 may be supplied the voltage of the battery supply (HVBatt). The low voltage output terminal of regulator 122 is tied to ground such that die 115 is supplied at 15 volts. In one embodiment, the ground that regulator 122 and die 115 are connected to is isolated from the ground that microcontroller 103 and die 113 are connected to. In one embodiment, the HVBatt is at 400 VDC.

Modules 105 and 107 each include signal lines with galvanic isolation barriers for exchanging signals between the low voltage die and the high voltage die. In one embodiment, the low voltage die and the high voltage die are positioned within the integrated circuit package to enable operation of the galvanic isolation barrier signal paths. In some embodiments, the die are stacked on top of each other in the integrated circuit package. In other embodiments, the die are located side by side in an integrated circuit package. In still other embodiments, the die way be located offset from each other. In still other embodiments, the die may be located in different integrated circuit packages.

Microcontroller 103 includes interrupt terminals (Int1* and Int2*) that are asserted low when a low voltage die (109, 113), respectively, wants to generate an interrupt. In some embodiments, the interrupt signals from the modules may be tied to one interrupt pin of microcontroller 103. In the embodiment shown, other signals may be exchanged between microcontroller 103 and the low voltage die 109 and 113 of driver modules 105 and 107 such as clocking and I/O signals.

In the embodiment shown, when conductive, IGBT 121 provides current from a battery source (not shown) to the phase A motor windings. When conductive, IGBT 123 sinks current to the battery ground from the phase A motor windings. In one embodiment, IGBTs 121 and 123 are not conductive at the same time. In some embodiments, the pulses of PWM1 and PWM2 are at a high state at opposite times. In some embodiments, there may be dead times between the on times of the two IGBTs to avoid connecting the high voltage battery terminal to ground.

System 101 includes resistors 131, 133, 135, and 137 that are connected to a gate of one of the IGBTs 121 and 123 to reduce the rate of transition of the gate driver voltage from a high voltage to a low voltage and vice versa. This reduction in the rate of transition acts to reduce the noise associated with a relatively fast switching signal. System 101 includes other circuitry 117 and 119 which are coupled to the terminals of IGBTs 121 and 123 respectively and terminals of modules 105 and 107, respectively. In one embodiment, the circuitry includes resistors, capacitors, and diodes for providing regulated voltages at the terminals. In some embodiments, other circuitry 117 and 119 may be used to detect short circuits, either by sensing the emitter of an IGBT sense leg (if the IGBT includes it), or by sensing the collector voltage of the IGBT.

Increasing the "on" time of the pulses provided to IGBT 121 acts to raise the voltage of the Phase A winding terminal with the greatest amount of on time occurring at the maximum sinusoidal voltage of the Phase A winding terminal. The on time of the gate voltage provided to IGBT 123 is increased to lower the voltage of the Phase A winding terminal where the maximum amount of on time is at the lowest value of the sinusoidal voltage at the Phase A winding terminal.

In some embodiments pulses are provided to both IGBTs 121 and 123 during the peak and valley portions of a sinusoidal cycle. However, in other embodiments, the pulses would be supplied to IGBT 121 only during the high portion of the sinusoid cycle and pulses would be supplied to IGBT 123 only during the low portions of the sinusoidal cycle. In some embodiments, an IGBT can be made continuously on during some modes.

IGBTs 121 and 123 and modules 105 and 107 are utilized for providing a regulated voltage to the phase A windings of the motor from power provided by a battery pack (not shown) at a voltage of HVBatt. System 101 includes two other sets of IGBTs (similar to IGBTs 121 and 123) and module pairs (similar to modules 105 and 107) (neither set shown) for controlling the voltages to the other two phase windings of the motor. The low voltage die of these other modules are also supplied with PWM signals from microcontroller 103. In some embodiments, system 101 includes a backup microcontroller coupled to the driver modules in case microcontroller 103 fails.

In one embodiment, the three phases of the motor (not shown) are connected in a Y configuration. The corresponding PWM signals provided to the other two sets are out of phase with PWM1 and PWM2 by 120 degrees. In one embodiment, the resultant voltages provided to the three windings simulate (with some degree of error) 3 sinusoidal voltages 120 degrees out of phase with each other at the desired frequency.

In other embodiments, a motor controller may work in other ways or include other circuitry. Also, in other embodiments, system 101 may be used in other applications such as for controlling different phase motors or for regulating voltages in a switching power supply. In some embodiments, system 101 can be used to regulate the voltage supplied to a traction motor to propel a vehicle. In other embodiments, system 101 can be used to boost the voltage of a battery pack such as with a switching power supply. System 101 can also be used in an inverter to convert power from DC to AC. In other embodiments, other types of power switches (e.g. power MOSFETs) can be used in place of the IGBTs.

Figure 2:
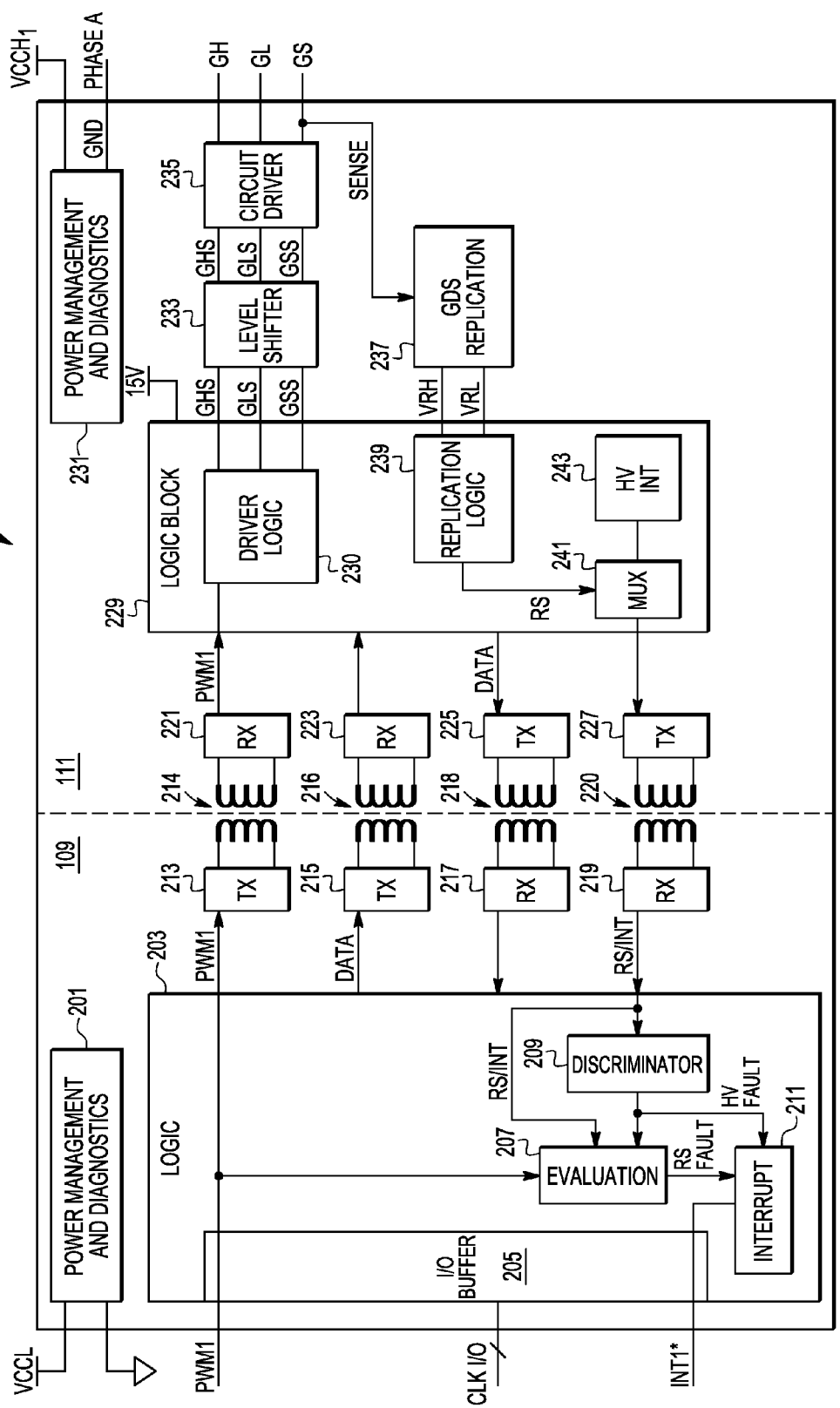
FIG. 2 is a circuit diagram of a driver module according to one embodiment of the present invention.

FIG. 2 is a circuit diagram of driver module 105 according to one embodiment of the present invention. As stated earlier, in one embodiment, module 105 includes a high voltage die 111 and a low voltage die 109 integrated in the same integrated circuit package.

Low voltage die 109 includes power management module and diagnostics circuit 201 which receives the low supply voltage VCCL and provides regulated supply and reference voltages to the circuits of low voltage die 109 as well as includes circuitry for preforming diagnostics on the externally received supply voltage.

Low voltage die 109 also includes logic block 203. Logic block 203 includes an I/O buffer 205 for receiving and providing signals (e.g. PWM1, CLK, I/O, and interrupt signals) external to die 109 including signals exchanged with microcontroller 103. Logic 203 includes circuitry for performing various functions such as communications, diagnostics (including built in self tests), and data manipulation. However, logic 203 may include circuitry for performing other functions in other embodiments.

High voltage die 111 includes power management module and diagnostics circuit 231 which receives a supply voltage (VCCH1) from regulator 120 and provides regulated supply and reference voltages to the circuits of high voltage die 111 as well as includes circuitry for preforming diagnostics on the externally received supply voltage. High voltage die 111 also includes a logic block 229 that includes circuitry for receiving and providing data to low voltage die 109. Logic block 229 also includes monitoring circuitry, testing circuitry, and calibration circuitry as well. In other embodiments, logic block 229 may include circuitry for performing other functions.

As shown in FIG. 2, power module 105 includes four galvanic isolation barrier signal paths to permit the exchange of data between the die but prevent the flow of current between the die. One signal path includes transmitting circuitry 213, transformer 214, and receiver circuitry 221 for transmitting the PWM1 signal from die 109 to die 111. Another signal path includes transmitting circuitry 215, transformer 216, and receiving circuitry 223 for transmitting data from die 109 to die 111. Still another signal path includes transmitting circuitry 225, transformer 218, and receiving circuitry 217 for providing data from die 111 to die 109. As will be discussed later, the signal path that includes transmitting circuitry 227, transformer 220, and receiving circuitry 219 transmits the replication/interrupt signal from die 111 to die 109. Although the galvanic barrier isolation signal paths are implemented with transformers, in other embodiments, a galvanic barrier isolation signal path may be implemented with other types of devices such as opto-isolators, capacitors, Hall Effect sensors, and magneto-couplers.

Die 109 includes circuitry for receiving a PWM1 signal from microcontroller 103 (via I/O buffers 205). Die 109 provides the PWM1 signal to high voltage die 111 via the galvanic isolation barrier signal path of transmitting circuitry 213, transformer 214, and receiver circuitry 221. Driver logic 230 of logic block 229 receives the PWM1 signal and uses it to generate three driving signals in response (GHS, GLS, and GSS). Those three signals are provided to level shifters 233 which shift the voltage of the signals (e.g. from 1.5 Volts to 5 volts). The three signals are then provided to gate driver circuit 235 (see FIG. 3). Gate driver circuit produces drive signal GH which is provided to resistor 131, drive signal GL which is provided to resistor 133, and drive signal GS which is provided directly to the control terminal of IGBT 121. These three signals are combined at node 341 to form the gate drive signal (GDS1) for controlling the conductivity of IGBT 121.

Figure 3:
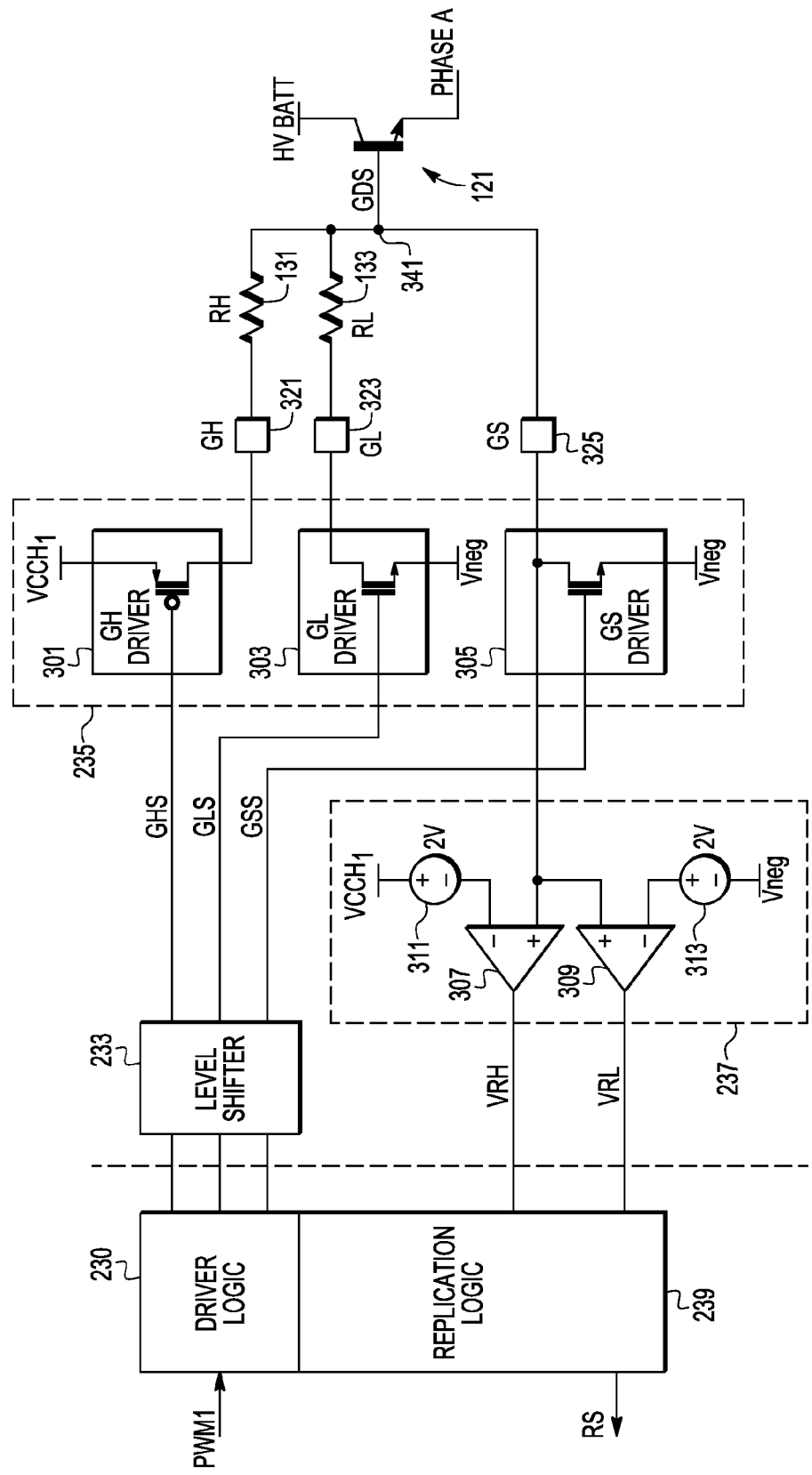
FIG. 3 is a circuit diagram of a portion of the system of FIG. 1 according to one embodiment of the present invention.

The gate drive signal GDS1 is provided to the GDS replication circuit 237 (See FIG. 3). Circuit 237 includes voltage comparators that are set to provide indications (signals VRH and VRL) when the GDS1 signal meets certain voltage thresholds. The VRH and VRL signals are provided to replication logic circuit 239 of logic block 229 (See FIG. 4) which uses the VRH and VRL signals to generate a replicated signal (RS). The replicated signal provides indications of state changes of the gate drive signal. In one embodiment, the replicated signal is a signal that has the same frequency and is synchronous or nearly synchronous with GDS1. However, in other embodiments, the replicated signal may be a multiple of or a fractional frequency of the GDS1 signal and/or may have a different duty cycles than the GDS1 signal.

Figure 4:
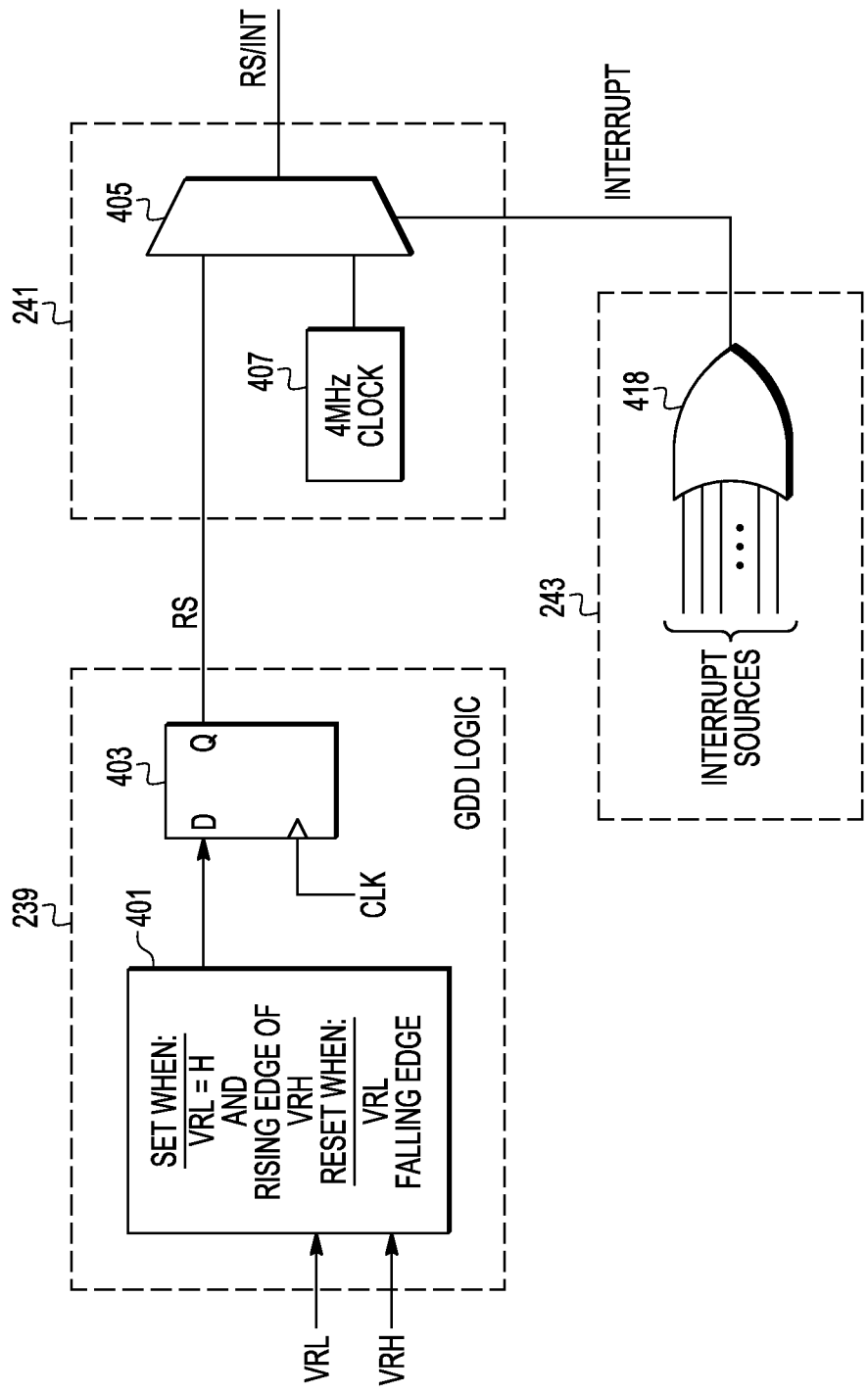
FIG. 4 is a circuit diagram of a portion of the system of FIG. 1 according to one embodiment of the present invention.

The replicated signal (RS) is provided to a multiplexer circuit 241 (see FIG. 4). Multiplexer circuit 241 is used to provide to low voltage die 109, the replicated signal over the same galvanic isolation barrier signal path (circuitry 227, transformer 220, and circuitry 219) as an interrupt signal produced from interrupt circuit 243. Using the same signal path to provide both an interrupt and the replicated signal enables the system to need fewer of the relatively "costly" galvanic isolation barrier signal paths.

Logic block 203 of low voltage die 109 includes a discriminator circuit 209 (see FIG. 6) which is used to determine whether the received signal (on signal line RS/INT) sent by multiplexer circuit 241 was an interrupt or the replicated signal. If the replicated signal was sent, evaluation circuit 207 (See FIG. 7) compares the PWM1 signal received from microcontroller 103 with the replicated signal to determine if the circuitry providing the gate drive signal to IGBT 121 is operating properly. If it is not operating properly, circuit 207 generates an RS fault signal to interrupt circuit 211, which generates an interrupt to microcontroller 103 indicating that there is a problem with the gate drive circuitry. Also, interrupt circuit 211 receives an indication (HVFault) when the discriminator circuit 209 determines that an interrupt was sent by multiplexer circuit 241 via the galvanic isolation barrier signal path of circuitry 219, transformer 220, and circuitry 227. Interrupt circuit 211 also generates an interrupt to microcontroller 103 in response to the HVFault signal, or other interrupt condition detected by logic 203. In response to the generation of the RS Fault signal, logic 203 stops providing the PWM1 signal to die 111 to cease the generation of the GDS1 signal.

Although FIG. 2 shows one configuration of a power driver module according to one embodiment of the present invention, other embodiments may have other configurations or include other circuits in other embodiments.

FIG. 3 is a circuit diagram showing one embodiment of circuitry of high voltage die 111 for generating the gate drive signal (GDS 1) provided to the gate of IGBT 121 and of circuitry for generating the replicated signal (RS) from the gate drive signal. As stated earlier, logic 230 generates three signals (GHS, GLS, and GSS) from the PWM1 signal which are level shifted and provided to the control terminals of gate drivers 301, 303, and 305, respectively, of gate driver circuit 235. In the embodiment shown, gate driver 301 is implemented with a PMOS transistor whose drain is connected to resistor 131 via die module terminal GH 321. The source of the gate driver transistor is connected to a positive voltage (e.g. VCCH1). Gate drivers 303 and 305 are each implemented as NMOS transistors with their sources connected to a negative voltage supply ((Vneg), e.g. −8V), which is below the emitter voltage to more strongly turn off IGBT 121. The drain of the transistor of gate driver 303 is connected to resistor 133 via module terminal GL 323 and the drain of the transistor of gate driver 305 is connected to the gate of IGBT 121 via module terminal 325 and node 341. The other side of resistors 131 and 133 are connected to node 341. The signal GSS drives the GS terminal 325 to Vneg to strongly keep IGBT 121 turned off when desired. The combination of the outputs of drivers 301, 303, and 305 at node 341 act to provide the gate drive signal (GDS1) to the gate of IGBT 121 to control the conductivity of IGBT 121.

The GS terminal 325 is also used as a sense terminal of the voltage at node 341. The GDS replication circuit 237 receives the GDS1 signal via its connection to terminal 325. Circuit 237 includes a comparator 307 that receives the GDS1 signal at its non inverting input. The inverting input of comparator 307 is connected to voltage source 311 that provides a two volt drop from VCCH1. Comparator 307 produces a high voltage output when the GDS1 signal is within two volts of VCCH. Circuit 237 includes a comparator 309 whose inverting input is tied to a two volt voltage source 313 that provides a reference voltage that is two volts above the negative voltage terminal (Vneg). The non inverting input of comparator 309 receives the GDS1 signal via terminal 325. Comparator 309 provides a signal VRL at its output that is high when the GDS1 signal is two volts higher than Vneg. The VRL and VRH signals are provided to replication logic circuit 239.

FIG. 4 shows a circuit diagram of replication logic circuit 239, HV interrupt circuit 243, and multiplexer circuit 241. Logic circuit 239 includes logic circuit 401 which receives both the VRL signal and the VRH signal. Logic circuit 401 provides at its output a high voltage value if VRL is at a high voltage and it detects a rising edge of VRH. Logic circuit 401 provides a low voltage output on the detection of a falling edge of VRL. Logic circuit 239 includes a D flip flop 403 to synchronize the output of logic circuit 401 with a system clock (clk) edge to provide the replicated signal RS. In one embodiment, the system clock is significantly faster (e.g. over 10 times) the frequency of the gate drive signal. In one embodiment the gate drive signal GDS1 has a frequency in the range of 5-40 KHz (e.g. 10-15 KHz) and the system clock (clk) has a frequency of 50 MHz, but these values may be different in other embodiments.

Multiplexer circuit 241 includes an input to receive the RS signal and a second input to receive a 4 MHZ clock signal from clock 407. The 4 MHz clock has a significantly higher frequency than the frequency of the gate drive signal (e.g. 5 KHz-40 KHz) HV interrupt circuit 243 provides an indication to generate an interrupt to the control input of multiplexer 405. The HV interrupt may be generated in response to a number of conditions such as an over voltage, under voltage, IGBT short circuit or over current, IGBT over temperature, VCC or other supplies out of range, and excessive IC temperature. When no interrupt needs to be asserted, the output of OR gate circuit 418 is low, which causes multiplexer 405 to provide the RS signal at its output. When circuit 243 wants to assert an interrupt due to receiving a signal indicating an interrupt, the output of OR gate circuit 418 is driven high which causes multiplexer 405 to provide the 4 MHz clock signal at its output, indicating an interrupt.

Figure 5:
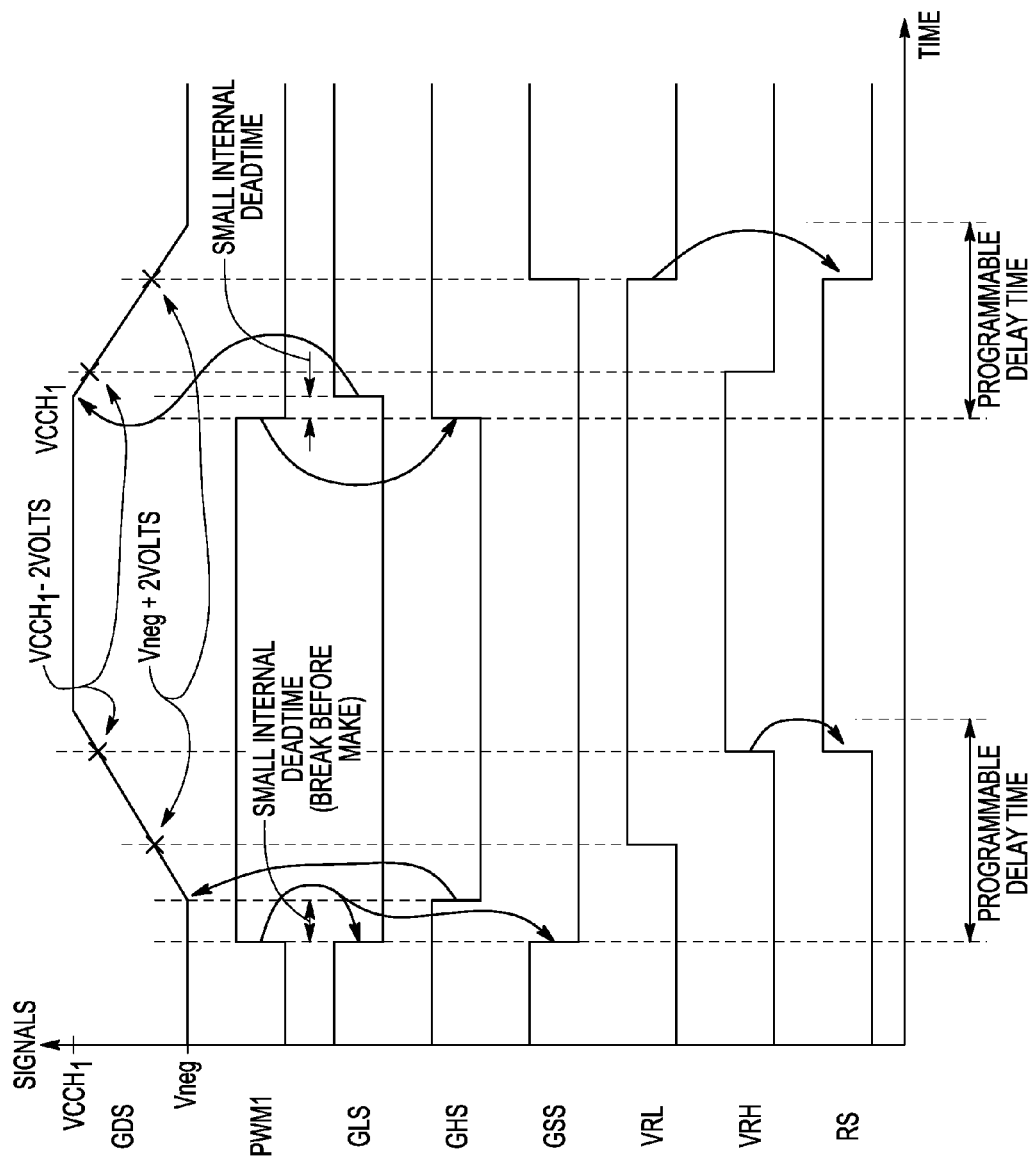
FIG. 5 is a timing diagram according to one embodiment of the present invention.

FIG. 5 shows a timing diagram according to one embodiment of the present invention. FIG. 5 shows the GDS1 signal during its rise to and fall from a high voltage state that causes IGBT 121 to become conductive during a cycle of the GDS1 signal. The cycle starts with the PWM1 signal going high. In response, logic 230 pulls GLS and GSS to low values which turn off gate drivers 303 and 305, respectively to decouple the GL and GS terminals from Vneg. After a predetermined amount of "dead time," logic 230 pulls the GHS signal low which causes driver 301 to couple terminal GH to the high voltage source VCCH1. This dead time ensures that node 341 is not coupled to both Vneg and the high voltage source at the same time. In one embodiment, the dead time is 20 ns, but may be of other values in other embodiments. Coupling node 341 to VCCH1 through gate driver 301 pulls the voltage of node 341 up which cause IGBT 121 to conduct.

The PWM1 signal subsequently going low causes logic 230 to turn off gate driver 301 to decouple node 341 from VCCH1. After a predetermined amount of dead time, logic 230 pulls GLS high to turn on GL driver 303 to pull node 341 to Vneg, which turns off IGBT 121. Afterwards, logic 230 asserts a high voltage for GSS which also couples node 341 to Vneg.

As the voltage of node 341 (GDS1) rises above 2 volts from Vneg, VRL goes high. When the voltage of node 341 rises within two volts of VCCH1, the VRH signal transitions to a high voltage. Upon the rising edge of VRH (and the next cycle of the clock (clk) into the clock input of D-flip flop 403), the replicated signal (RS) transitions to a high voltage value. When the voltage of the GDS1 signal falls within 2 volts of Vneg, the VRL signal transitions to a low voltage where the replicated signal changes states to a low value on the next change of the clk signal into D-flip flop 403. In this embodiment, the replicated signal is at the same frequency as the PWM signal, although the duty cycles of the PWM1 signal and the RS signal may be different depending on the relative sizes of resistors 131 and 133. In one embodiment, die 111 may include level shifting circuitry to reduce the voltage of the VRL and VRH signals prior to being provided to logic circuit 239. In other embodiments, the GDS1 and RS signals can be generated by other circuitry or other techniques. For example, in one embodiment, the RS signal may be generated with the use of a voltage divider with the GDS1 signal being an input to the voltage divider.

Using two comparators provides the replication circuit with a hysteresis function such that a momentary voltage glitch does not undesirably change the state of the replicated signal.

Figure 6:
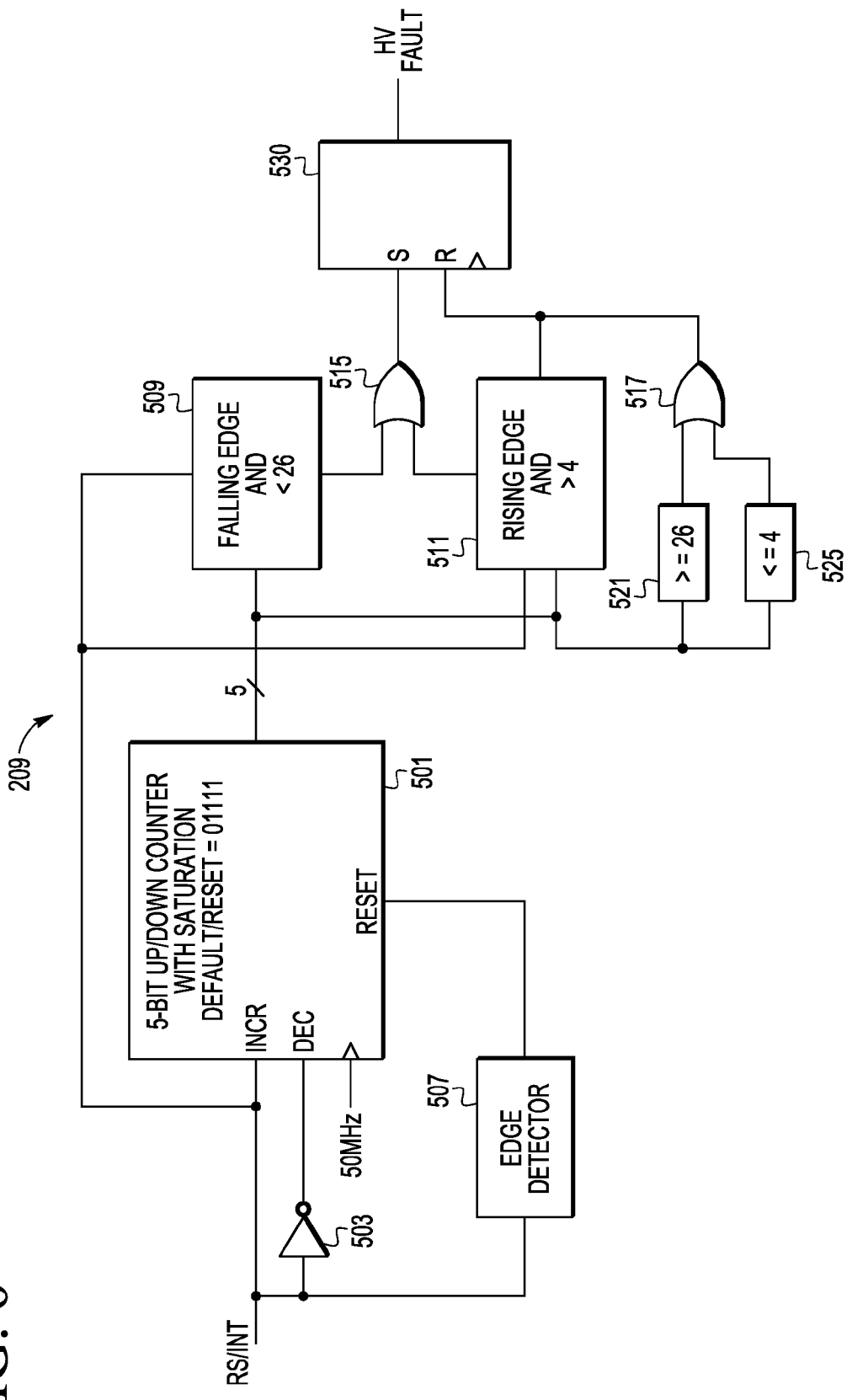
FIG. 6 is a circuit diagram of a portion of the system of FIG. 1 according to one embodiment of the present invention.

FIG. 6 shows a circuit diagram of one embodiment of a discriminator circuit 209 that is used to determine whether the replicated signal or an HV interrupt is being provided on the RS/INT signal line by multiplexer circuit 241 via the galvanic isolation barrier signal path of transmitting circuitry 227, transformer 220, and receiver circuitry 219.

Circuit 209 includes a 5 bit up/down counter 501 with saturation. The counter has a default reset setting of fifteen (01111). Counter 501 includes an increment input that is connected to the RS/Interrupt (RS/INT) signal line and a decrement input that is connected to the output of inverter 503. The input of inverter 503 is connected to the RS/INT signal line. Counter 501 increments its count when the RS/INT signal line is at a high voltage and decrements its count when the RS/INT signal line is at a low voltage. Circuit 209 includes an edge detector circuit 507. When an edge is detected on the RS/interrupt signal line, counter 501 is reset.

Circuit 209 includes logic blocks 509, 511, 521, and 525 that are configured to receive the five bit output of counter 501. Logic block 509 asserts a high value when there is a falling edge on the RS/INT signal line and when the count is less than 26. This condition is indicative of the RS/INT signal line being high for a short period of time, which would indicate that the RS/INT signal line is conveying an interrupt because of the relatively fast 4 MHz interrupt signal provided by multiplexer circuit 241. Logic block 511 asserts a high value when there is a rising edge on the RS/INT signal line and when the count is greater than 4. This condition indicates that the RS/INT signal line was previously at a low value for a short period of time, which would indicate that the RS/INT signal line is conveying an interrupt because of the relatively fast 4 MHz interrupt signal provided by multiplier circuit 241. The outputs from both logic block 509 and logic block 511 are provided to OR gate circuit 515. If either of the signals are high, the output of OR gate circuit 515 goes high which causes SR flip flop 530 to produce a high value at its output indicating that an interrupt was sent on the RS/INT line.

Logic block 521 asserts a high value when the count of counter 501 is greater than or equal to 26. This indicates that the RS/INT signal line has a relatively lower frequency than the 4 MHz clock, which would indicate that the RS/INT signal line is conveying the replicated signal. Logic block 525 asserts a high value when the count is less than or equal to 4. This indicates that the signal on the RS/INT signal line has a relatively lower frequency than the 4 MHz clock, which would indicate that the RS/INT signal line is conveying the replicated signal. The signals from both logic block 521 and logic block 525 are provided to OR gate circuit 517. If either of these signals are high, the output of OR gate circuit 517 goes high which causes flip flop 530 to reset and produce a low value at its output indicating that the replicated signal is being sent on the RS/INT signal line.

Figure 7:
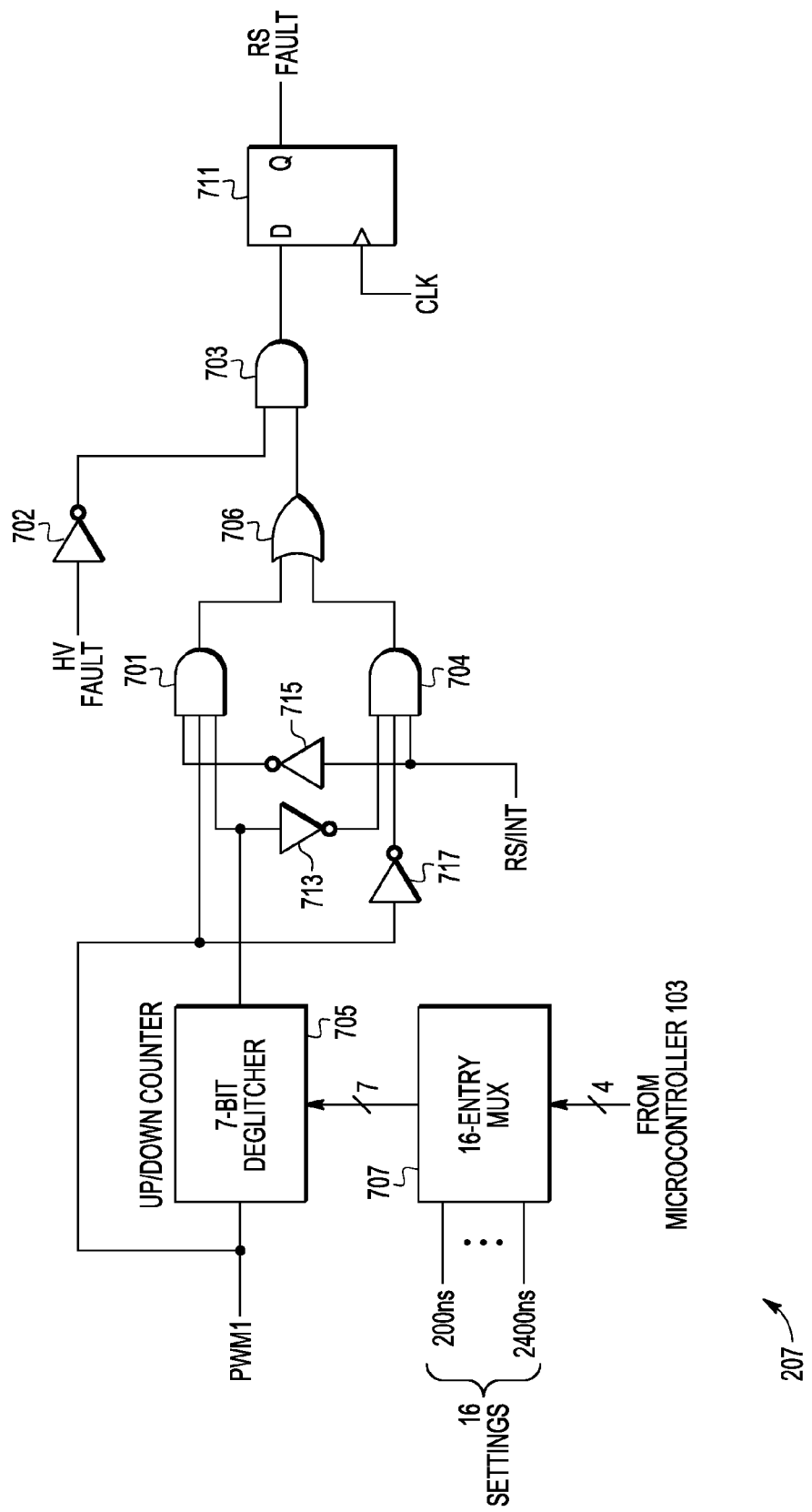
FIG. 7 is a circuit diagram of a portion of the system of FIG. 1 according to one embodiment of the present invention.

FIG. 7 is a circuit diagram of one embodiment of evaluation circuit 207. Evaluation circuit 207 compares the replicated signal (RS) with the PWM1 signal provided from microcontroller 103 to determine if the gate driver circuitry of module 105 is working properly. If it's not working properly, evaluation circuit 207 asserts the RS Fault signal indicating that there is an issue in providing the gate drive signal.

Circuit 207 includes a 7-bit deglitcher circuit 705 that provides at its output, a delayed version of the PWM1 signal that is delayed by a predetermined period of time ("delay time"). In the embodiment shown, the delay time of the deglitcher circuit 705 is programmably set by a 7 bit number that is provided to circuit 705 from multiplexer circuit 707. In the embodiment shown, any one of 16 different delay settings corresponding to delay times ranging from 200 ns to 2400 ns can be provided to deglitcher circuit 705. In the embodiment shown, the particular setting provided to circuit 705 is selected by the 4 bit selection value provided from microcontroller 103, which selects one of the 16 delay settings connected to an input of multiplexer circuit 707. In other embodiments, the delay setting provided to deglitcher circuit 705 may be hard wired or set by fuses. Deglitcher circuit 705 also filters out momentary spikes or transients that may be present in the PWM signal.

Circuit 207 includes two AND gate circuits 701 and 704 whose outputs are connected to the inputs of OR gate circuit 706. The output of OR gate circuit 706 provides an indication (by providing a high voltage value) of whether the RS signal and the PWM1 signal are mismatched for a period of time longer than the programmed delay time of deglitcher circuit 705, thereby indicating a problem with module 105 in providing the gate drive signal to IGBT 121.

AND gate circuit 701 receives at its inputs, the PWM1 signal, the output of deglitcher circuit 705 (the delayed PWM1 signal), and the inverted RS signal from inverter 715. AND gate circuit 701 detects the fault condition of when the voltage state of the RS signal does not match a high voltage state of the PWM1 signal after the programmed delay time of deglitcher circuit 705 has passed. If the RS signal is slower than the output of deglitcher circuit 705 in transitioning to a high value to match the high value of the PWM1 signal (as indicated by the PWM1 being high, the output of circuit 705 being high, and the RS signal being low), then the output of AND gate circuit 701 goes high which causes the output of OR gate circuit 706 to go high (indicating a fault). If the RS signal transitions to a high value to match the high value of the PWM1 signal before the output of circuit 705 transitions to a high value (as indicated by the PWM1 signal being high, the RS signal being high, and the output of circuit 705 being low), then the output of AND gate circuit 701 will be low (indicating no fault) due to the output of inverter 715 going low before the output of circuit 705 goes high.

AND gate circuit 704 receives at its inputs, the inverted PWM1 signal (from inverter 717), the inverted output of deglitcher circuit 705 (from inverter 713), and the RS signal. AND gate circuit 704 detects the fault condition of when the voltage state of the RS signal does not match a low voltage state of the PWM1 signal after the programmed delay time of deglitcher circuit 705 has passed. If the RS signal is slower than the output of deglitcher circuit 705 in transitioning to a low value to match the low value of the PWM1 signal (as indicated by the PWM1 being low, the output of circuit 705 being low, and the RS signal being high), then the output of AND gate circuit 704 goes high which causes the output of OR gate circuit 703 to go high (indicating a fault). If the RS signal transitions to a low value to match the low value of the PWM1 signal before the output of circuit 705 transitions to a low value (as indicated by the PWM1 signal being low, the RS signal being low, and the output of circuit 705 being high), then the output of AND gate circuit 701 will be low (indicating no fault) due to the RS signal going low before the output of circuit 705 goes low.

See FIG. 5 showing the relationship of the "programmable delay time" to the transition of the RS signal when the module is operating properly in providing the gate drive signal. As shown in FIG. 5, the RS signal changes state before the expiration of the programmable delay time from the change of state of the PWM1 signal, which indicates proper operation.

Referring back to FIG. 7, evaluation circuit 207 receives the HV Fault signal from discriminator circuit 209. If circuit 209 indicates that an interrupt signal was sent on the RS/INT signal line, then output of OR gate circuit 706 is disabled by AND gate circuit 703 receiving the inverted HV fault signal from invertor 702. If the RS signal was provided on the RS/INT signal line, then the output of OR gate circuit 706 is provided to D flip flop 711 where it is synchronized with the system clock (clk) to provide the RS Fault signal indicating that there is a fault with the system in providing the gate drive signal. In response to the RS Fault signal, the interrupt circuit 211 generates an interrupt to microcontroller 103 and the PWM1 signal is ceased to be provided to high voltage die 111.

In other embodiments, the evaluation circuit may have other configurations and/or include other circuitry. For example, in some embodiments, the evaluation circuit may include an XOR circuit for comparing the PWM1 and RS signals.

Although in the embodiment shown, module 105 compares the replicated signal to determine whether the system is operating properly by comparing it to the PWM1 signal, the replicated signal may be used for other purposes in other embodiments. For example, the replicated signal could be used to monitor the actual duty cycle of the gate drive signal, which could be used to provide an indication of the integrity of the gate drive signal by detecting if one edge is switching too fast or too slow. It also could be used to minimize the dead-time between the on time of one IGBT (121) and the on time of the other IGBT (123) that control the winding voltage for the same phase. This information could be used to safety extend the min/max duty cycle and improve "crossover" distortion in controlling the motor. Furthermore, in other embodiments, a power module may include other circuitry to provide the replicated signal (e.g. a voltage divider), or may determine proper operation of the gate control system from the replicated signal using other techniques. Although FIGS. 3-7 show circuitry and timing diagrams for one embodiment of driver module 105, other driver modules of the system (e.g. driver module 107) may include similar circuitry and operate in a similar manner.

Using a replicated signal to determine whether the gate drive signal is being properly generated may advantageously provide a system that can more quickly determine whether the system has failed as opposed to a system that relies on flag settings to provide an indication of system failure. Furthermore, using the replicated signal to determine whether the gate drive signal is being properly generated may allow for real time testing during the operation of the circuit, as opposed to systems that require a test mode to determine proper operation.

In one embodiment, a control system includes a first voltage domain circuit. The first voltage domain circuit includes circuitry for operating in a first voltage domain. The control system includes a second voltage domain circuit. The second voltage domain circuit includes circuitry for operating in a second voltage domain. The second voltage domain circuit includes a driver circuit. The driver circuit for providing a control terminal driving signal to make conductive a power switch. The second voltage domain circuit includes a replication circuit, the replication circuit having an output to provide a replicated signal of the control terminal driving signal. The control system includes a galvanic isolation barrier signal path between the first voltage domain circuit and the second voltage domain circuit. The replicated signal is provided by the second voltage domain circuit to the first voltage domain circuit via the galvanic isolation barrier signal path.

In another embodiment, a method of operating a power switch includes providing by a first voltage domain circuit a drive signal to a control terminal of a power switch to control the conductivity of the power switch. The method includes utilizing, by the first voltage domain circuit, the drive signal to generate a replicated signal of the drive signal. The method further includes providing by the first voltage domain circuit, the replicated signal to a second voltage domain circuit via a galvanic isolation barrier signal path between the first voltage domain circuit and the second voltage domain circuit.

In one embodiment, a control system includes a first die and a second die. The first die includes an evaluation circuit. The second die includes a driver circuit and a replication circuit. The driver circuit includes circuitry utilized in the generation of a control terminal driving signal from a pulse width modulated signal to make conductive a power switch. The replication circuit has an output to provide a replicated signal of the control terminal driving signal. The control system includes a first galvanic isolation barrier signal path between the first die and the second die. The first die operable to provide the pulse width modulated signal to the second die via the first galvanic isolation barrier signal path. The control system includes a second galvanic isolation barrier signal path between the first die and the second die. The replicated signal is provided by the second die to the first die via the second galvanic isolation barrier signal path. The evaluation circuit compares the pulse width modulated signal with the replicated signal.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A control system, the control system comprising:
   a first voltage domain circuit, the first voltage domain circuit including circuitry for operating in a first voltage domain;
   a second voltage domain circuit, the second voltage domain circuit including circuitry for operating in a second voltage domain, the second voltage domain circuit comprising:
     a driver circuit, the driver circuit for providing a control terminal driving signal to make conductive a power switch;
     a replication circuit, the replication circuit having an output to provide a replicated signal of the control terminal driving signal;
   a galvanic isolation barrier signal path between the first voltage domain circuit and the second voltage domain circuit, wherein the replicated signal is provided by the second voltage domain circuit to the first voltage domain circuit via the galvanic isolation barrier signal path.

2. The system of claim 1 wherein:
   the first voltage domain circuit includes a first signal output configured to provide an output signal;
   a second galvanic isolation barrier signal path for providing the output signal to the second voltage domain circuit;
   the driver circuit is responsive to the output signal in providing the control terminal driving signal.

3. The system of claim 1 wherein the first voltage domain circuit includes an evaluation circuit, the evaluation circuit utilizes the replicated signal to determine whether the second voltage domain circuit is operating properly in providing the control terminal drive signal.

4. The system of claim 3 wherein the first voltage domain circuit includes an input to receive a pulse signal for controlling the generation of the control terminal driving signal, wherein the evaluation circuit compares the pulse signal with the replicated signal.

5. The system of claim 4 wherein the evaluation circuit includes a circuit for providing an indication of a time delay that is used to compare the replicated signal to the pulse signal.

6. The system of claim 1 wherein during operation, the control terminal driving signal is characterized a pulse width modulated signal.

7. The system of claim 1 wherein the replicated signal changes state in response to changes of state of the control terminal driving signal.

8. The system of claim 1 wherein the second voltage domain circuit further includes a multiplexer circuit, the multiplexer circuit including a plurality of inputs, the plurality of inputs including a first input to receive the replicated signal, the plurality of inputs including a second input to receive a signal indicating an assertion of an interrupt signal to the first voltage circuit domain, the multiplexer circuit including an output which provides a signal from a selected one of the plurality of inputs to the galvanic isolation barrier signal path.

9. The system of claim 1 wherein the first voltage domain circuit, the second voltage domain circuit, and the galvanic isolation barrier signal path are implemented in a single integrated circuit package.

10. The system of claim 1 wherein the galvanic isolation barrier signal path is also configured to provide an indication of an interrupt to the first voltage domain circuit from the second voltage domain circuit.

11. A method of operating a power switch, the method comprising:
    providing by a first voltage domain circuit a drive signal to a control terminal of a power switch to control the conductivity of the power switch;
    utilizing, by the first voltage domain circuit, the drive signal to generate a replicated signal of the drive signal;
    providing by the first voltage domain circuit, the replicated signal to a second voltage domain circuit via a galvanic isolation barrier signal path between the first voltage domain circuit and the second voltage domain circuit.

12. The method of claim 11 wherein the drive signal is characterized as a pulse width modulated signal having a first frequency.

13. The method of claim 12 wherein the replicated signal is characterized as a pulse signal at the first frequency.

14. The method of claim 11 wherein the second voltage domain circuit utilizes the replicated signal to evaluate a performance of the first voltage domain circuit in providing the drive signal.

15. The method of claim 11 wherein the second voltage domain circuit compares the replicated signal with a first signal used to generate the drive signal to evaluate a performance of the first voltage domain circuit in providing the drive signal.

16. The method of claim 15 wherein the second voltage domain circuit provides the first signal to the first voltage domain circuit via a second galvanic isolation barrier signal path between the first voltage domain circuit and the second voltage domain circuit.

17. The method of claim 11 wherein the first voltage domain circuit includes a replication circuit having an output to generate the replicated signal, wherein the first voltage domain circuit includes a first circuit having an output to generate an interrupt signal, the method further comprising:

selecting a signal from at least the output of the replication circuit and the output of the first circuit to provide over the galvanic isolation barrier signal path.

18. The method of claim 11 where the power switch is an IGBT.

19. The method of claim 11 wherein the power switch is used to control a voltage provided to a motor winding.

20. A control system, the control system comprising:
a first die, the first die including an evaluation circuit;
a second die, the second die comprising:
  a driver circuit, the driver circuit including circuitry utilized in the generation of a control terminal driving signal from a pulse width modulated signal to make conductive a power switch;
  a replication circuit, the replication circuit having an output to provide a replicated signal of the control terminal driving signal;
a first galvanic isolation barrier signal path between the first die and the second die, the first die operable to provide the pulse width modulated signal to the second die via the first galvanic isolation barrier signal path;
a second galvanic isolation barrier signal path between the first die and the second die, wherein the replicated signal is provided by the second die to the first die via the second galvanic isolation barrier signal path;
wherein the evaluation circuit compares the pulse width modulated signal with the replicated signal to determine whether the second die is operating properly in the generation of the control terminal driving signal.

* * * * *